United States Patent
Zeng et al.

(10) Patent No.: US 8,169,270 B2
(45) Date of Patent: May 1, 2012

(54) OVERLAPPING, TWO-SEGMENT CAPACITOR BANK FOR VCO FREQUENCY TUNING

(75) Inventors: Yi Zeng, Fremont, CA (US); Tzu-wang Pan, Saratoga, CA (US); I-Hsiang Lin, Mountain View, CA (US)

(73) Assignee: QUALCOMM Incorporated, San Diego, CA (US)

( * ) Notice: Subject to any disclaimer, the term of this patent is extended or adjusted under 35 U.S.C. 154(b) by 18 days.

(21) Appl. No.: 12/437,462

(22) Filed: May 7, 2009

(65) Prior Publication Data

US 2010/0283551 A1 Nov. 11, 2010

(51) Int. Cl.
H03B 5/12 (2006.01)

(52) U.S. Cl. .................... 331/179; 331/117 FE

(58) Field of Classification Search ............ 331/177 V, 331/179, 177 R, 36 C, 117 R, 117 FE, 167
See application file for complete search history.

(56) References Cited

U.S. PATENT DOCUMENTS

| | | | |
|---|---|---|---|
| 6,940,358 B1 * | 9/2005 | Meacham | ........... 331/117 R |
| 7,113,052 B2 | 9/2006 | Dunworth | |
| 7,696,830 B2 * | 4/2010 | Ohara et al. | ............. 331/17 |
| 2006/0192598 A1 | 8/2006 | Baird et al. | |
| 2007/0188243 A1 * | 8/2007 | Waheed et al. | ........... 331/16 |
| 2009/0066431 A1 | 3/2009 | Shin et al. | |

FOREIGN PATENT DOCUMENTS

| | | |
|---|---|---|
| WO | WO2005104347 | 11/2005 |
| WO | WO2007060210 | 5/2007 |

OTHER PUBLICATIONS

International Search Report and Written Opinion—PCT/US2010/034129, International Search Authority—European Patent Office—Nov. 23, 2010.

* cited by examiner

*Primary Examiner* — Ryan Johnson
(74) *Attorney, Agent, or Firm* — Kevin T. Cheatham

(57) ABSTRACT

A VCO (for example, in an FM receiver) includes an LC resonant tank. The LC resonant tank includes a coarse tuning capacitor bank and a fine tuning capacitor bank. The coarse tuning capacitor bank contains a plurality of digitally controlled coarse tuning capacitor elements, each providing a first capacitance value when active. The fine tuning capacitor bank contains a plurality of digitally controlled fine tuning capacitor elements, each providing a second capacitance value when active. To address the practical problem of capacitor mismatch, capacitance overlap throughout the VCO tuning range is created by selecting the first and second capacitance values such that the capacitance value of the fine capacitor bank is greater than the first capacitance value when all of the digitally controlled fine tuning capacitor elements of the fine capacitor bank are active.

19 Claims, 11 Drawing Sheets

OVERLAPPING, TWO-SEGMENT CAPACITOR BANK FOR VCO FREQUENCY TUNING

VCO WITH DIGITALLY CONTROLLED CAPACITOR BANK

NONLINEARITY OF A BINARY CODED IMPLEMENTATION OF A
DIGITALLY CONTROLLED CAPACITOR BANK

VCO IN FM TRANSCEIVER OF
A MOBILE COMMUNICATION DEVICE

CAPACITOR BANK SELECTION LOGIC

SIMULATION OF OVERLAPPING BETWEEN COARSE AND FINE BANKS

| TARGET VCO_OUT | 2.393 GHZ | | | |
|---|---|---|---|---|
| ITERATION | BIT CHANGE | VCO_OUT | CAPACITOR BANK CODE (DECIMAL) | 10-BIT CAPACITOR BANK CODE (BINARY) |
| 1 | 9 | 2.768 GHZ | 512 | 100000 0000 |
| 2 | 8 | 2.548 GHZ | 256 | 010000 0000 |
| 3 | 7 | 2.456 GHZ | 128 | 001000 0000 |
| 4 | 6 | 2.413 GHZ | 64 | 000100 0000 |
| 5 | 5 | 2.393 GHZ | 32 | 000010 0000 |
| 6 | 4 | 2.403 GHZ | 48 | 000011 0000 |
| 7 | 3 | 2.405 GHZ | 40 | 000010 1000 |
| 8 | 2 | 2.399 GHZ | 36 | 000010 0100 |
| 9 | 1 | 2.396 GHZ | 34 | 000010 0010 |
| 10 | 0 | 2.394 GHZ | 33 | 000010 0001 |

BINARY SEARCH OVER 10-BIT CODE

FIG. 10A

| TARGET VCO_OUT | 2.393 GHZ | | | |
|---|---|---|---|---|
| ITERATION | BIT CHANGE | VCO_OUT | CAPACITOR BANK CODE (DECIMAL) | 10-BIT CAPACITOR BANK CODE (BINARY) |
| 1 | 9 | 2.787 GHZ | 520 | 100000 1000 |
| 2 | 8 | 2.563 GHZ | 264 | 010000 1000 |
| 3 | 7 | 2.469 GHZ | 136 | 001000 1000 |
| 4 | 6 | 2.426 GHZ | 72 | 000100 1000 |
| 5 | 5 | 2.405 GHZ | 40 | 000010 1000 |
| 6 | 4 | 2.395 GHZ | 24 | 000001 1000 |
| 7 | 4 | 2.385 GHZ | 8 | 000000 1000 |
| 8 | 3 | 2.383 GHZ | 16 | 000001 0000 |
| 9 | 2 | 2.389 GHZ | 20 | 000001 0100 |
| 10 | 1 | 2.392 GHZ | 22 | 000001 0110 |
| 11 | 0 | 2.393 GHZ | 23 | 000001 0111 |

BINARY SEARCH OVER 6-BIT COARSE CODE FOLLOWED
BY BINARY SEARCH OVER 4-BIT FINE CODE

FIG. 10B

IMPLEMENTING A CAPACITOR BANK CODE FOR AN OVERLAPPING, TWO SEGMENT CAPACITOR BANK

OVERLAPPING, TWO-SEGMENT CAPACITOR BANK FOR VCO FREQUENCY TUNING

BACKGROUND

1. Technical Field

The present disclosure relates to wireless communication systems, and more particularly to a mobile communication device that includes a voltage controlled oscillator.

2. Background Information

Wireless communication devices originally provided only the capability of voice communication. Now wireless communication devices have evolved to provide other communication, information and entertainment capabilities communicated over a broader range of frequencies. These additional capabilities require frequency synthesizers operable over increasingly broad, tunable frequency ranges with low noise sensitivity. Achieving low noise sensitivity is particularly difficult where the added function requires a broad, tunable frequency range for operation. For example, receiving frequency modulation (FM) radio signals is one communication function that requires a frequency synthesizer to generate signals over a broad range of frequencies to process the radio signals received over the entire FM frequency band. For a mobile communication device that is to be sold in a worldwide market, it is desirable to receive radio signals not only in the FM band used in the United States, Canada and Europe (87.5 MHz to 108.0 MHz), but also in the FM band used in Japan (76 MHz to 90 MHz). Thus, the overall frequency range of radio signals to be processed is from 76.0 MHz to 108.0 MHz.

A typical frequency synthesizer used in Radio Frequency (RF) processing of voice and data communications employs a Phase Locked Loop (PLL) where the PLL includes a voltage-controlled oscillator (VCO) with an inductor-capacitor (LC) tank. It would be undesirable to use a frequency synthesizer with a VCO that oscillates over the relatively low frequencies between 76 and 108 MHz. Such a VCO would be large and could not be practically integrated onto a single integrated circuit with the FM transceiver. Thus, frequency synthesizers for communication functions typically generate higher frequency signals that are divided down by a divisor. But, the absolute range of the higher frequency signals increases proportionately to the divisor. For example, a VCO tunable from 2.736 to 3.127 GHz, useable to address a range of FM radio signals, requires a tunable frequency range of 391 MHz.

A large VCO gain is typically required to realize a relatively broad frequency tuning range. However, a large VCO gain tends to increase the noise sensitivity of the PLL and increases the loop sensitivity to power supply noise. Also, for a given loop bandwidth, a large VCO gain requires a relatively large loop filter capacitor, complicating on-chip integration. Thus, a design for a VCO is desired that meets the requirements of a wide frequency tuning range and minimizes the noise sensitivity of the PLL by maintaining a relatively low VCO gain.

FIG. 1 (prior art) illustrates a typical VCO design with a digitally controlled capacitor bank. VCO 11 uses a voltage controlled capacitor (varactor) 15 to actively control the oscillation frequency of the VCO output signal 17. By varying the capacitance of the varactor 15 in response to a control voltage 16 the overall capacitance of LC resonant tank 12 and the resulting VCO oscillation frequency are changed. To keep the VCO gain relatively low, the range of capacitance of varactor 15 is minimized. However, this limits the range of oscillation frequencies achievable by control of varactor 15 alone. To compensate, a digitally controlled capacitor bank 13 is coupled in parallel with the varactor to provide a digitally controlled capacitance value upon which the capacitance value of the varactor 15 is added. The digitally controlled capacitor bank 13 includes tuning capacitor elements coupled in parallel as illustrated. Each tuning capacitor element includes a pair of capacitors and a switching element. Digital control lines 14 control the capacitance value of the digitally controlled capacitor bank 13 by selectively activating each tuning capacitor element. Thus, the range of tunable frequencies of VCO 11 is expanded.

A successful capacitor bank design requires that each possible target frequency (and corresponding capacitance) within the tunable frequency range be addressable by some combination of tuning capacitor elements within the capacitor bank 13 and the varactor 15. Each incremental step of capacitance of the capacitor bank 13 should not leave gaps in the corresponding range of capacitance that cannot be compensated by the varactor 15. Each incremental step should be small and uniform to limit the size of varactor 15. In modern designs, a capacitor bank of 10-bit resolution is often required to meet design requirements.

When each tuning capacitor element is designed to provide the same capacitance, the resulting capacitor bank is commonly termed a thermometer-coded capacitor bank. A relatively linear, step-wise increase in capacitance results as each successive tuning capacitor element is activated. But, a single segment thermometer-coded implementation requires a relatively large number of capacitors to achieve high resolution. For example, a 10-bit solution would require 1023 ($2^n$-1) individual capacitors. The complexity and size of the physical routing and decoder logic required to provide and control such a large number of capacitors is prohibitive. This limits the practicability of a single segment, thermometer-coded capacitor bank.

To reduce the number of capacitors required to address a range of tunable frequencies, a binary coded approach may be employed. In an exemplary 4-bit binary coded approach, a first tuning capacitor element has a first capacitance value, a second tuning capacitor element has twice the capacitance, a third tuning capacitor element has four times the capacitance, and a fourth tuning capacitor element has 16 times the capacitance. The binary coded approach provides a broad range of capacitance with relatively few capacitors. For example, a 10-bit solution requires only ten tuning capacitor elements. However, the binary coded method is susceptible to capacitor mismatches. In practice, individual capacitor values vary from their nominal value and these mismatches result in irregular steps in capacitance for each increment of the capacitor bank code.

FIG. 2 (prior art) illustrates an example of the change of capacitance for each increment of the capacitor bank code of a 7-bit binary coded design. Under ideal conditions, the incremental change of capacitance should be a single value for each step in the code. However, in practice, as illustrated in FIG. 2, a binary coded implementation exhibits a broad variation in incremental change of capacitance. To address each possible target frequency in a range of tunable frequencies, a varactor 15 with a relatively large tunable capacitance is required. This results in an undesireably large VCO gain.

One approach to minimize this limitation of a binary coded implementation is to introduce a two-segment capacitor bank where one segment is binary coded and the second segment is thermometer-coded. Such a two-segment approach has the potential to reduce the number of tuning capacitor elements required to achieve a particular value of capacitor bank resolution. For additional detail, see: U.S. Pat. No. 7,113,052, entitled "Coarse Frequency Tuning In A Voltage Controlled Oscillator", issued Sep. 26, 2006, by Jeremy D. Dunworth.

Another approach to reduce variation in the incremental change of capacitance is to trim the capacitors of the capacitor bank at the manufacturing stage to minimize mismatches. However, this approach is costly and adds complexity to the manufacturing process. Another approach is to calibrate the code associated with each individual capacitor bank to match the target frequency for each step. Such a calibrated code may be stored in an on-board look-up table for future use. Again, this approach is costly and adds complexity to the control logic implementation. Thus, a digitally controlled tuning capacitor bank of relatively few tuning capacitor elements is desired that is capable of providing a broad range of capacitance values; addressable in uniform steps at high resolution.

SUMMARY

A Frequency Modulation (FM) radio tuner with a wide frequency range operates in a mobile communication device. The FM radio tuner includes a transceiver that in turn includes a Voltage Controlled Oscillator (VCO). The VCO outputs an oscillatory VCO output signal whose frequency is tunable over a frequency range. To achieve a broad range of tunable oscillation frequency and low noise sensitivity, the VCO includes an LC resonant tank circuit with an overlapping, two-segment switching capacitor bank. The two-segment switching capacitor bank includes a coarse tuning capacitor bank and a fine tuning capacitor bank. The LC resonant tank also includes a voltage controlled capacitor (varactor) coupled in parallel with the coarse and fine tuning capacitor banks. Together these three elements (the varactor, the coarse tuning capacitor bank, and the fine tuning capacitor bank) determine the capacitance of the LC resonant tank of the VCO, and consequently the oscillation frequency of the VCO.

The coarse tuning capacitor bank includes a number of digitally controlled tuning capacitor elements. Each of these elements is coupled between two oscillating voltage nodes of the VCO. Each coarse tuning capacitor element provides a substantially similar capacitance value between the two nodes when the coarse tuning capacitor is active. How many of the coarse tuning capacitor elements are active, and therefore the capacitance of the coarse tuning capacitor bank is determined by a multi-bit coarse capacitor bank code.

The fine tuning capacitor bank also includes a number of digitally controlled tuning capacitor elements. Each of these elements is coupled between the two oscillating voltage nodes of the VCO. Each fine tuning capacitor element provides a substantially similar capacitance value when active. The capacitance value provided by a fine tuning capacitor element is less, however, than the capacitance value provided by a coarse tuning capacitor element. How many of the fine tuning capacitor elements are active, and therefore the capacitance of the fine tuning capacitor bank, is determined by a multi-bit fine capacitor bank code.

A capacitor bank where each active tuning capacitor element provides a substantially similar capacitance value is commonly termed a thermometer-coded capacitor bank. Thermometer-coded capacitor banks generally reduce the nonlinearity in incremental capacitance change for each increment of the capacitor bank code. This reduces the likelihood of large gaps in the range of tunable frequencies, but does not eliminate the risk entirely. Capacitor size mismatches due to variations in the fabrication process of the capacitor elements remain. These mismatches may result in undesireable gaps in the range of tunable frequencies of the VCO.

An overlap of capacitance is created between the coarse and fine capacitor banks to mitigate the effects of capacitor size mismatches. As overlap is increased, the tolerance for process variation and capacitor size mismatch increases. Overlap is created by selecting the capacitance value of each of the fine tuning capacitor elements such that when all of the fine tuning capacitor elements are active, their combined capacitance exceeds the capacitance of a single, active, coarse tuning capacitor element.

An overlapping, two-segment capacitor bank achieves a broad range of tunable frequencies with a relatively small number of capacitor elements. The coarse tuning capacitor elements define a relatively large range and the fine tuning capacitor elements interpolate each incremental step of coarse capacitance at high resolution. Thus, fewer capacitors are required in the overlapping, two-segment capacitor bank than would otherwise be required if a single segment, thermometer-coded capacitor bank were employed. By using fewer capacitors in the LC resonant tank, fewer switches are required to switch the capacitors. By using fewer switches, less parasitic capacitance is generated which would otherwise limit the range of tunable frequencies.

In one embodiment, a mobile communication device includes a Frequency Modulation (FM) receiver. The FM receiver includes a frequency synthesizer utilizing a VCO as part of a Phase-Locked Loop (PLL). The mobile communication device uses the FM receiver to receive transmissions from FM radio stations. The VCO includes an overlapping, two-segment capacitor bank in its LC resonant tank. By employing the overlapping, two-segment capacitor bank in the VCO, the frequency synthesizer can generate a broad range of oscillation frequencies with low noise sensitivity. A tunable frequency range from 2.736 to 3.127 GHz is achieved with a coarse tuning capacitor bank of sixty-three capacitors addressed by a 6-bit coarse capacitor bank code and a fine tuning capacitor bank of fifteen capacitors addressed by a 4-bit fine capacitor bank code. The composite 10-bit digital capacitor bank code determines the capacitor bank codes for both the coarse and fine tuning capacitor banks.

An amount of capacitor bank selection logic receives a multi-bit channel selection input value and based thereon outputs a 10-bit digital word that controls the coarse and fine capacitor banks such that the oscillating frequency of the VCO has a desired corresponding oscillating frequency. In a calibrating operation, the capacitor bank selection logic counts the number of transitions of the VCO clock signal that occur in a half-cycle of a reference clock, and compares the counted number with a target value. Depending on whether the counted number of transitions is higher or lower than the target number, the 10-bit digital word is changed accordingly, and the process is repeated. After a few iterations, the 10-bit digital word that results in the counted number of transitions being substantially equal to the target value is determined. For each multi-bit channel selection input value there is one target value, and the capacitor bank selection logic generates a corresponding 10-bit digital word for controlling the coarse and fine capacitor banks.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 10A is a table illustrative of iterative selection steps of a capacitor bank control code using a binary search over a 10-bit control code.

FIG. 10B is a table illustrative of iterative selection steps of a capacitor bank control code using a binary search over a 6-bit control code of a coarse capacitor bank followed by a binary search over a 4-bit control code of a fine capacitor bank.

DETAILED DESCRIPTION

An overlapping, two-segment capacitor bank is disclosed here for use in tuning a VCO. Each tuning capacitor element of the first segment has substantially the same capacitance value, A, when active. Each tuning capacitor element of the second segment has substantially the same capacitance value, B, when active. A capacitor bank where each tuning capacitor element provides substantially the same capacitance value is commonly termed a thermometer-coded capacitor bank. Thermometer-coded capacitor banks reduce nonlinearities in incremental capacitance changes for each capacitor bank code in the face of capacitor mismatches. The two-segment approach exploits the difference between A and B to extend the range of capacitance of the capacitor bank with fewer tuning capacitor elements. By using fewer capacitors in the LC tank, fewer switches are required to switch the capacitors. By using fewer switches, less parasitic capacitance is generated which would otherwise limit the range of the LC tank. In one embodiment, a tunable frequency range from 2.736 to 3.127 GHz can be achieved with a coarse tuning capacitor bank of 63 capacitors and a fine tuning capacitor bank of 15 capacitors. A 10-bit capacitor bank code addresses both the coarse and fine tuning capacitor banks.

Figure 1:
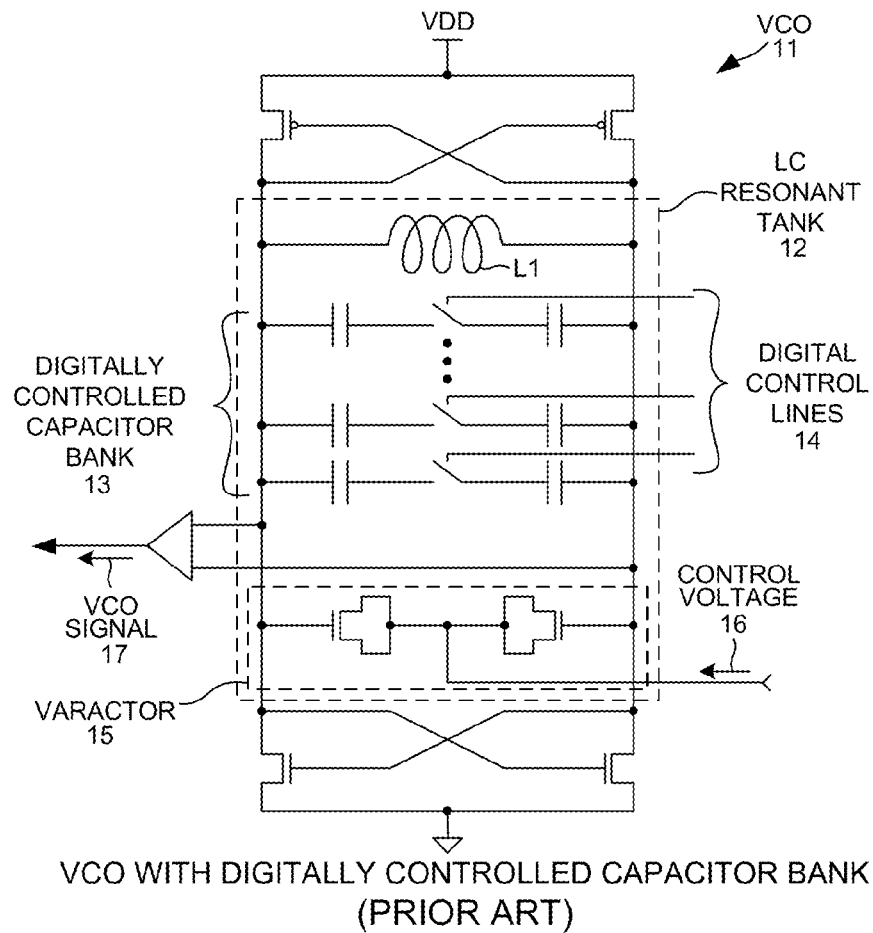
FIG. 1 (prior art) is a diagram illustrating a VCO with a digitally controlled capacitor bank.
Figure 2:
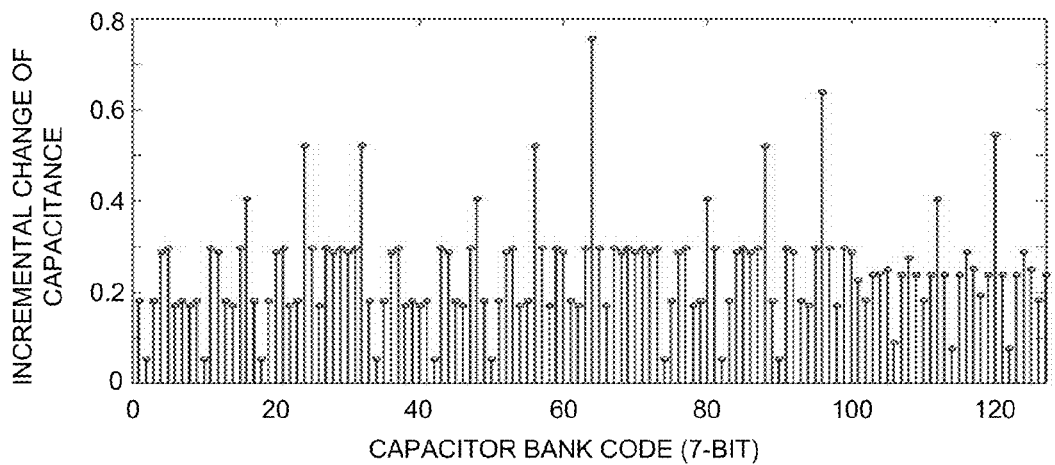
FIG. 2 (prior art) is a diagram illustrating the nonlinearity of a binary coded implementation of a digitally controlled capacitor bank. As the capacitor bank code is incremented, the corresponding incremental change of capacitor is not constant.
Figure 3:
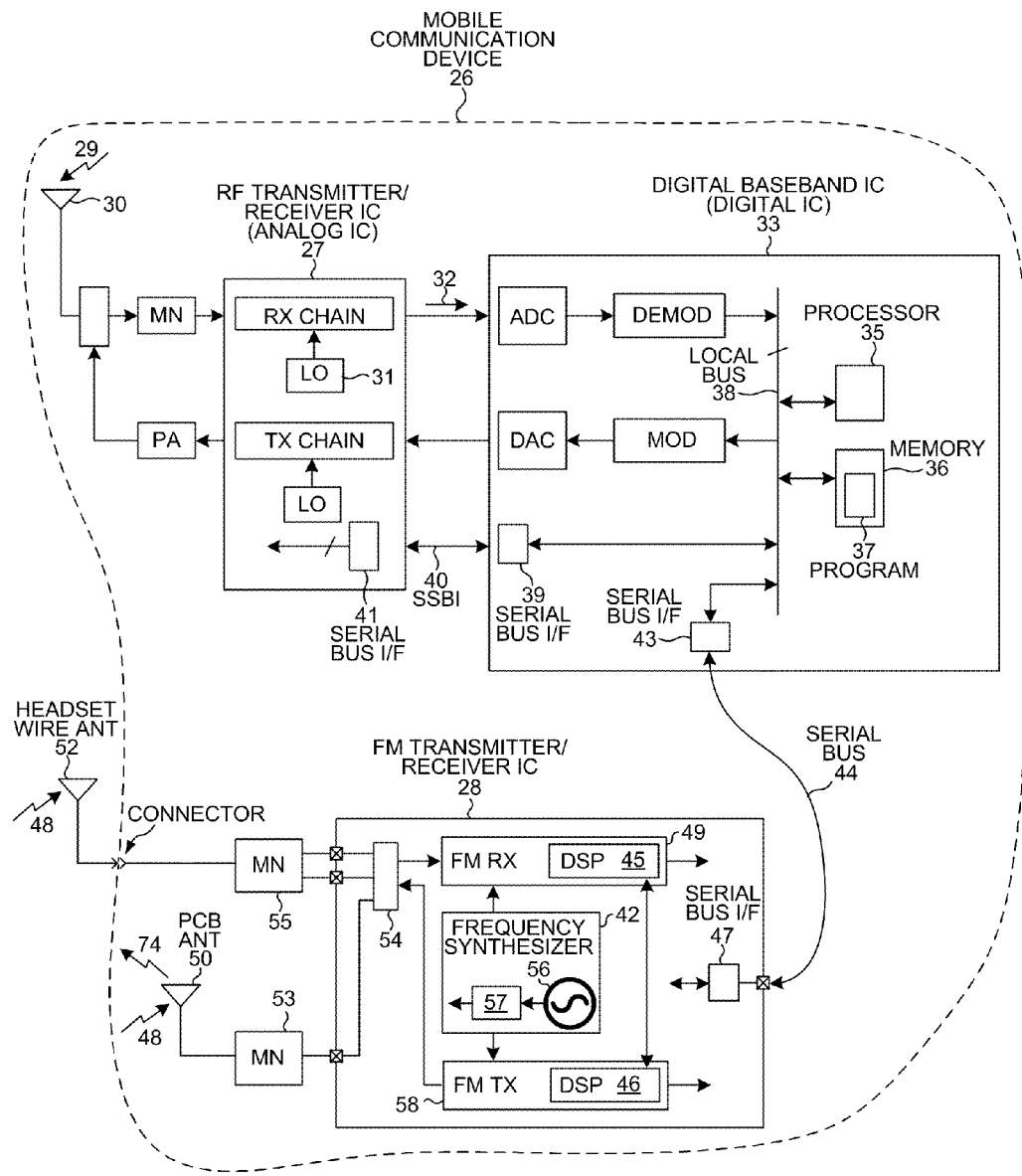
FIG. 3 is a simplified block diagram of a VCO in an FM transceiver 28 of a mobile communications device 26.

FIG. 3 is a diagram of a mobile communication device 26 that employs an overlapping, two-segment capacitor bank. In this particular example, mobile communication device 26 is a cellular telephone. In another example, mobile communication device 26 is an RF-enabled personal digital assistant (PDA). Mobile communication device 26 includes an RF transceiver integrated circuit (IC) 27 and an FM transceiver IC 28. Each of transceivers 27 and 28 is called a "transceiver" because it includes a transmitter as well as a receiver.

A first signal 29 is received onto an RF receiver on mobile communication device 26. In one embodiment, first signal 29 is a radio frequency signal transmitted by a base station. First signal 29 is received onto antenna 30, passes through a matching network (MN) and is processed by the receive chain of RF transceiver IC 27. The receive chain uses a LO signal generated by a local oscillator 31 to downconvert first signal 29 to a baseband signal 32 for subsequent digital signal processing by a digital baseband IC 33. In one implementation, an overlapping, two-segment capacitor bank could be advantageously employed as part of local oscillator 31 of the RF receive chain.

Digital baseband IC 33 includes, among other parts not illustrated, a digital processor 35 that executes instructions stored in a processor-readable medium 36. For example, processor-readable medium 36 includes program memory that stores instructions of a computer program 37 that, when executed, control the overlapping, two-segment capacitor bank. In one embodiment, processor 35 causes information to be communicated across a parallel local bus 38, a serial bus interface 39 and a serial bus conductors (SSBI) 40 to a serial bus interface 41 of RF transceiver IC 27. Thus, processor 35 controls the operation of local oscillator 31.

A second signal 48 is received onto an FM receiver 49 on mobile communication device 26. Second signal 48 is an FM radio frequency signal transmitted by a radio station in the FM radio band from 76-108 MHz. Where mobile communication device 26 is used in the United States, Canada or Europe, the frequency of second signal 48 falls within a frequency range from 87.5 MHz to 108.0 MHz. Where mobile communication device 26 is used in Japan, the frequency of second signal 48 falls within a frequency range from 76 MHz to 90 MHz.

In one implementation, second signal 48 is received onto an antenna 50 that is printed on the printed circuit board (PCB) onto which FM transceiver IC 28 is mounted. The size of the printed circuit board is limited within mobile communication device 26, and therefore the length of antenna 50 is also limited. Where better FM radio reception is desired by using a longer antenna, the user of mobile communication device 26 may use a longer headset wire antenna 52 that is integrated into the wire that connects the headset or earplug to mobile communication device 26. Where second signal 48 is received onto PCB antenna 50, second signal 48 passes through a matching network (MN) 53 and is received by a TR switch 54. Where second signal 48 is received onto wire antenna 52, second signal 48 passes through a matching network 55 and is received by TR switch 54. After being received onto TR switch 54, second signal 48 is processed by FM receiver 49.

To process second signal 48, FM receiver 49 uses a VCO signal generated by a VCO 56 and a programmable output divider 57 of frequency synthesizer 42. In one implementation, an overlapping, two-segment capacitor bank could be advantageously employed as part of VCO 56 employed by FM receiver 49. In one embodiment, processor 35 controls the operation of a frequency synthesizer 42 on FM transceiver IC 28. Processor 35 causes information to be communicated across parallel local bus 38, through serial bus interface 43, through serial bus 44, and to serial bus interface 47 of FM transceiver IC 28. In another embodiment, a second processor 45 and a third processor 46 located in FM transceiver IC 28 control some of the operations of frequency synthesizer 42. For example, processor 35 executes instructions that tune the FM receiver to a radio station specified by the user, whereas the processors in the FM transceiver IC 28 execute instructions that compute the capacitor bank code for VCO 56 in the FM transceiver.

In another example, FM transceiver IC 28 also has an FM transmitter 58 that can transmit audio signals received via I2C serial bus 44 from digital baseband IC 33. FM transmitter 58 uses a VCO signal generated by a VCO 56 of frequency synthesizer 42. In one implementation, an overlapping, two-segment capacitor bank could be advantageously employed as part of VCO 56 as employed by FM transmitter 58.

The term "computer" encompasses processor 35 that executes "code" (computer program 37) of instructions stored in memory 36 (a computer-readable medium). The term "computer" also encompasses the second and third processors 45-46 located in FM transceiver IC 28.

Figure 4:
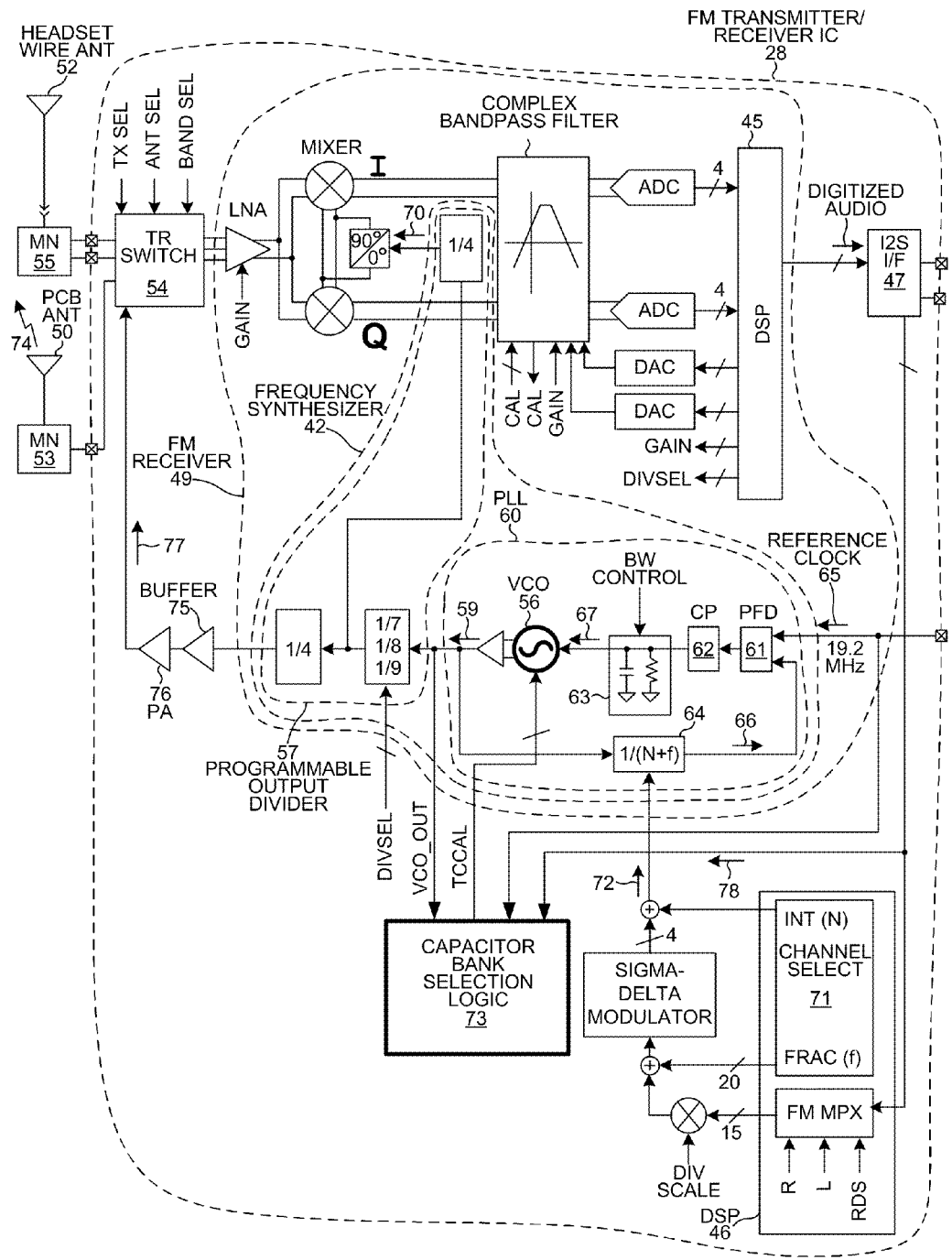
FIG. 4 is a more detailed block diagram of the FM transceiver 28 of FIG. 3.

FIG. 4 shows FM transceiver IC 28 in more detail and shows how FM receiver 49 generates a VCO signal 59 that is tuned to a particular value over a frequency range. In one example, frequency synthesizer 42 outputs a synthesizer signal 70 that is VCO signal 59 divided down by programmable output divider 57 by a factor of thirty-two. For this case, synthesizer signal 70 has a synthesizer frequency that varies over a frequency range from 85.50 to 97.71 MHz. For example, a lower-limit VCO frequency of 2.736 GHz divided by thirty-two is 85.50 MHz. Similarly, an upper-limit VCO frequency of 3.127 GHz divided by thirty-two is 97.71 MHz. When the user of mobile communication device 26 desires to listen to a radio station transmitted on a frequency that falls within this frequency range, VCO signal 59 is set at the one frequency that when divided down by thirty-two equals the frequency of the desired FM radio station. For example, if the user desires to listen to the San Francisco Bay Area FM radio station KOIT transmitted at 96.5 MHz, VCO signal 59 is set to 3,088 MHz.

VCO signal 59 is set to a desired frequency by setting the divisor (N+f) of frequency divider 64. Processor 35 sets the divisor (N+f) by controlling a channel select block 71 within third processor 46 of FM transceiver IC 28. Channel select block 71 outputs an integer output (N) and a fractional output (f) that are combined into a divisor setting signal 72 that sets the appropriate (N+f) value. By adjusting the (N+f) value received by frequency divider 64 the frequency generated by the LC tank of VCO 56 is changed by operation of phase-locked loop (PLL) 60. PLL 60 includes a phase frequency detector (PFD) 61, a charge pump 62, a loop filter 63, VCO 56, and a frequency divider 64. Phase frequency detector 61 compares the phase of a reference clock signal 65 to the phase of a feedback signal 66 and generates phase-error signals. In one embodiment, reference clock signal has a frequency of 19.2 MHz. Feedback signal 66 is a "divide-by-N" signal output by frequency divider 64. Frequency divider 64 divides the frequency of VCO signal 59. When the phase of feedback signal 66 lags behind that of reference clock signal 65, phase frequency detector 61 sends an accelerate control signal to charge pump 62. When the phase of feedback signal 66 leads that of reference clock signal 65, phase frequency detector 61 sends a decelerate control signal to charge pump 62. Charge pump 62 drains charge from its output lead upon receiving an accelerate control signal and adds charge to its output lead upon receiving a decelerate control signal. An input port of VCO 56 is coupled to an output lead of charge pump 62, and the charge drained and added by charge pump 62 constitutes a control voltage 67 received by VCO 56. Loop filter 63 is also coupled to the node that couples the input port of VCO 56 and the output lead of charge pump 62. In one embodiment, loop filter 63 is adjusted for bandwidth control. As control voltage 67 increases, the frequency of VCO signal 59 output by VCO 56 decreases.

An amount of capacitor bank selection logic 73 is used to tune the frequency generated by VCO 56 to a value close to the desired frequency. Capacitor bank selection logic 73 receives a multi-bit digital signal indicating a channel selection 78, the output signal 59 of VCO 56, and the reference clock signal 65. Capacitor bank selection logic 73 processes these signals to generate digital control signals to tune the capacitance of the LC tank of VCO 56. The resulting oscillation frequency of the tuned LC tank is close to the desired frequency. This minimizes the range of control voltage 67 required to achieve the desired oscillation frequency even when the desired frequency may be selected over a broad range of frequencies. This permits the design of a low gain VCO with low noise sensitivity.

Figure 5:
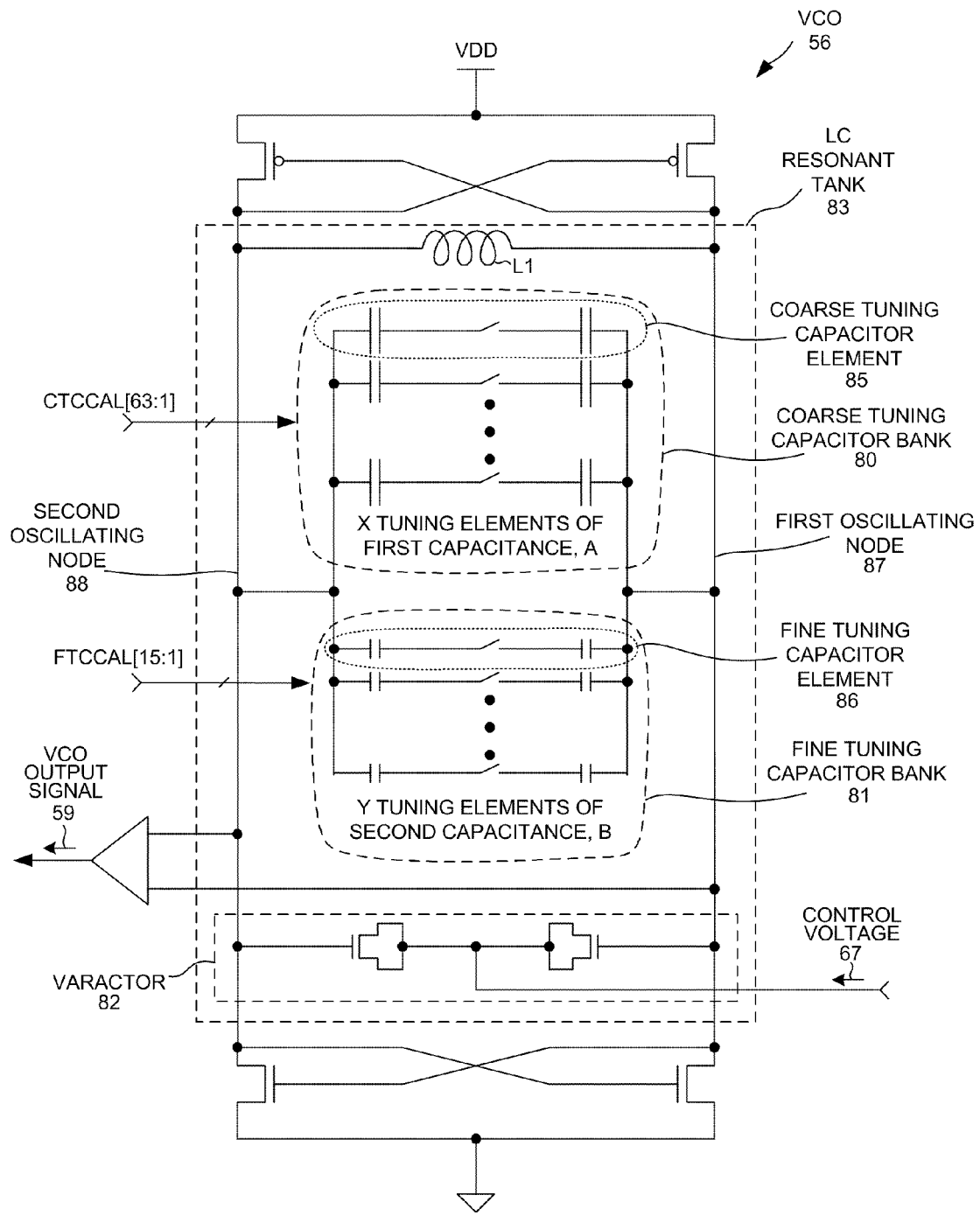
FIG. 5 is a simplified block diagram of the VCO 56 of the FM transceiver 28 of FIG. 3. The VCO 56 includes an overlapping, two-segment capacitor bank for VCO frequency tuning.

FIG. 5 shows VCO 56 in greater detail. VCO 56 includes an overlapping, two-segment tuning capacitor bank as part of an LC resonant tank 83. A first segment is a coarse tuning capacitor bank 80. Coarse tuning capacitor bank 80 includes X coarse tuning capacitor elements 85. A second segment is a fine tuning capacitor bank 81. Fine tuning capacitor bank 81 includes Y fine tuning capacitor elements 86. LC resonant tank 83 also includes a varactor 82. The capacitance of varactor 82 is controlled by control voltage input signal 67. VCO output signal 59 is an oscillatory signal whose oscillation frequency is determined by the resonance frequency of LC resonant tank 83. The resonance frequency is determined by the relative values of inductor L1 and the capacitance of the coarse tuning capacitor bank 80, the fine tuning capacitor bank 81, and varactor 82. Inductor L1, coarse tuning capacitor bank 80, fine tuning capacitor bank 81, and varactor 82 are electrically connected in parallel between a first oscillating node 87 and a second oscillating node 88 as illustrated. A calibration signal CTCCAL either connects or disconnects each successive tuning capacitor element of coarse tuning capacitor bank 80. When a particular coarse tuning capacitor element 85 is connected it provides a capacitance value, A to the LC resonant tank 83. A calibration signal FTCCAL either connects or disconnects each successive tuning capacitor element of fine tuning capacitor bank 81. When a particular fine tuning capacitor element 86 is connected it provides a capacitance value, B to the LC resonant tank 83. Thus, the capacitance of LC resonant tank 83 is actively controlled by calibration signals CTCCAL and FTCCAL and control voltage signal 67.

Figure 6:
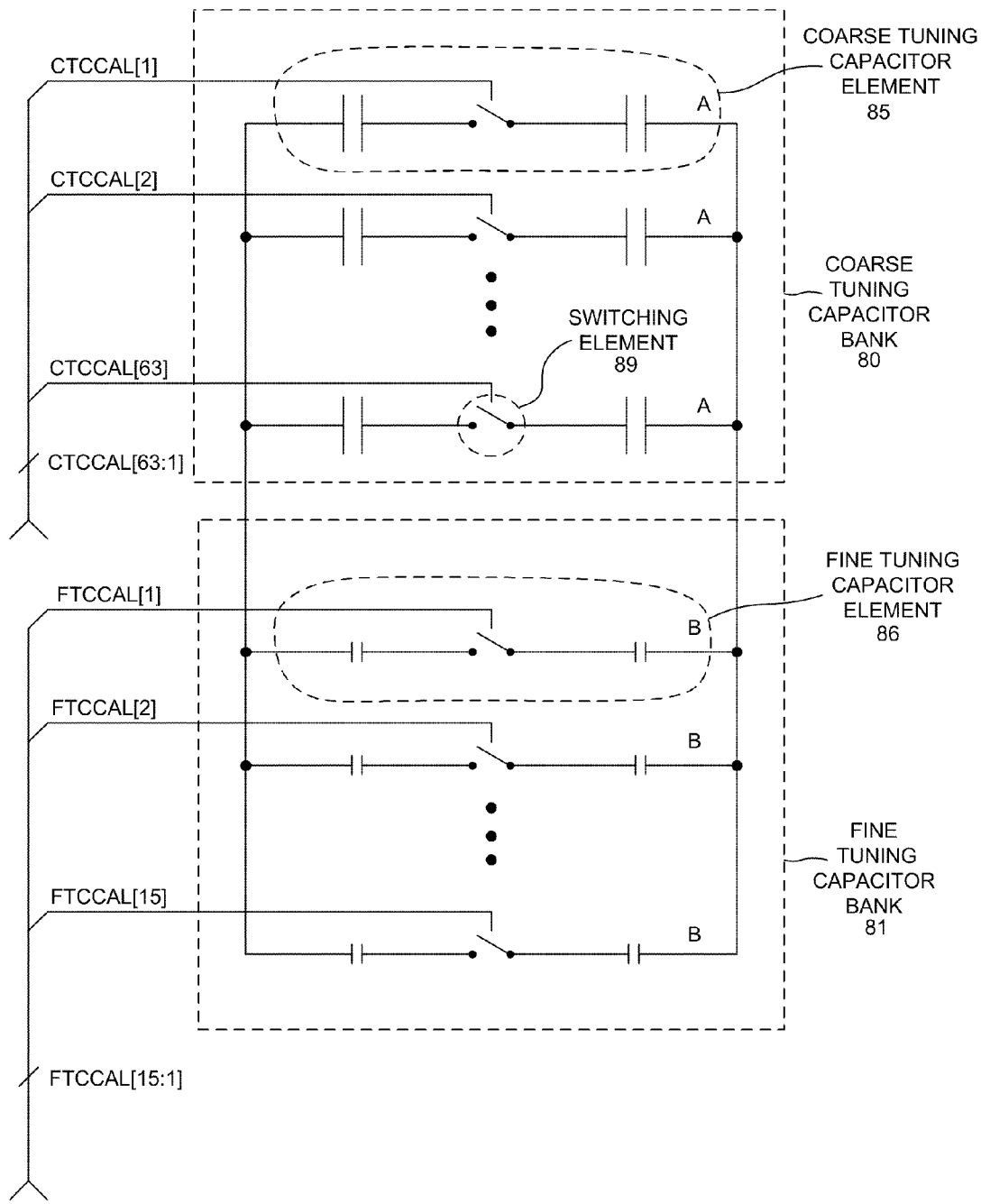
FIG. 6 is a more detailed diagram of the overlapping, two-segment capacitor bank of the VCO 56 of FIG. 5.

FIG. 6 illustrates coarse tuning capacitor bank 80 and fine tuning capacitor bank 81 in more detail. In one implementation, both the coarse tuning capacitor elements 85 and the fine tuning capacitor elements 86 of VCO 56 consist of a capacitor connected to a switching element 89 that is in turn connected to another capacitor. The capacitors of any tuning capacitor element are chosen to have substantially the same capacitance to equalize the capacitive loading on both oscillating nodes 87 and 88. In one example, coarse tuning capacitor bank 80 contains sixty-three coarse tuning capacitor elements 85. A digital control line communicating a single digital bit individually addresses each capacitor element 85. For example, a first digital control line, addressing a first coarse tuning capacitor element, communicates a first digital bit, CTCCAL [1]. For a first value of the digital bit, switching element 89 of the coarse tuning capacitor element is conductive, thus activating the element and electrically connecting it to the circuit of tuning capacitor elements connected in parallel. For a second value of the digital bit, switching element 89 of the coarse tuning capacitor element is not conductive, thus deactivating the element and electrically disconnecting it from the circuit of tuning capacitor elements connected in parallel. Where the switching element is conductive and electrically connects the coarse tuning capacitor element to the circuit, the coarse tuning capacitor element provides its capacitance to the circuit of LC resonant tank 83. Where the switching element is not conductive and electrically disconnects the element from the circuit of tuning capacitor elements in parallel, the coarse tuning capacitor element provides substantially no capacitance to the circuit of LC resonant tank 83. Fine tuning capacitor bank 81 comprises fifteen fine tuning capacitor elements 86. A digital control line communicating a single digital bit individually addresses each element 86. For example, a first digital control line addressing a first fine tuning capacitor element communicates a first digital bit, FTCCAL[1]. For a first value of the digital bit, switching element 89 of the fine tuning capacitor element is conductive, thus activating the element and electrically connecting it to the circuit of tuning capacitor elements connected in parallel. For a second value of the digital bit, switching element 89 of the fine tuning capacitor element is not conductive, thus deactivating the element and electrically disconnecting it from the circuit of tuning capacitor elements connected in parallel. Where the switching element is conductive and electrically connects the fine tuning capacitor element to the circuit, the fine tuning capacitor element provides its capacitance to the circuit of LC resonant tank 83. Where the switching element is not conductive and electrically disconnects the element from the circuit, the fine tuning capacitor element provides substantially no capacitance to the circuit of LC resonant tank 83.

In this example, sixty-three coarse tuning capacitor elements each of capacitance value A are selected in coordination with inductor L1 of resonant tank 83 to achieve a desired range of oscillation frequency, for example, 2.736 GHz to 3.127 GHz. In other implementations, coarse tuning capacitor element 85 may comprise a single capacitor and switching element or a plurality of capacitors and a switching element. Each fine tuning capacitor element 86 has a capacitance value of B. Capacitance value, B, is selected to fill gaps in the range of capacitance of LC resonant tank 83 due to the mismatch of capacitor values of the coarse tuning capacitor bank 80. In this example, fifteen fine tuning capacitor elements are selected such that the fifteen steps of the fine tuning capacitor bank 81 are approximately equal to two increments of capacitance of the coarse tuning capacitor bank 80. This creates substantial overlap between the range of capacitance values of the fine tuning capacitor bank 81 and the incremental change of capacitance of the coarse tuning capacitor bank 80. This overlap increases the likelihood that the full range of capacitance of the LC tank 83 can be reached despite the uncertainty in the incremental change of capacitance of coarse tuning capacitor bank 80 because of capacitor mismatches. In other implementations, fine tuning capacitor element 86 may comprise a single capacitor and switching element or a plurality of capacitors and a switching element. In other implementations, other combinations of A and B can be selected to achieve varying ranges of capacitance and varying amounts of overlap.

Figure 7:
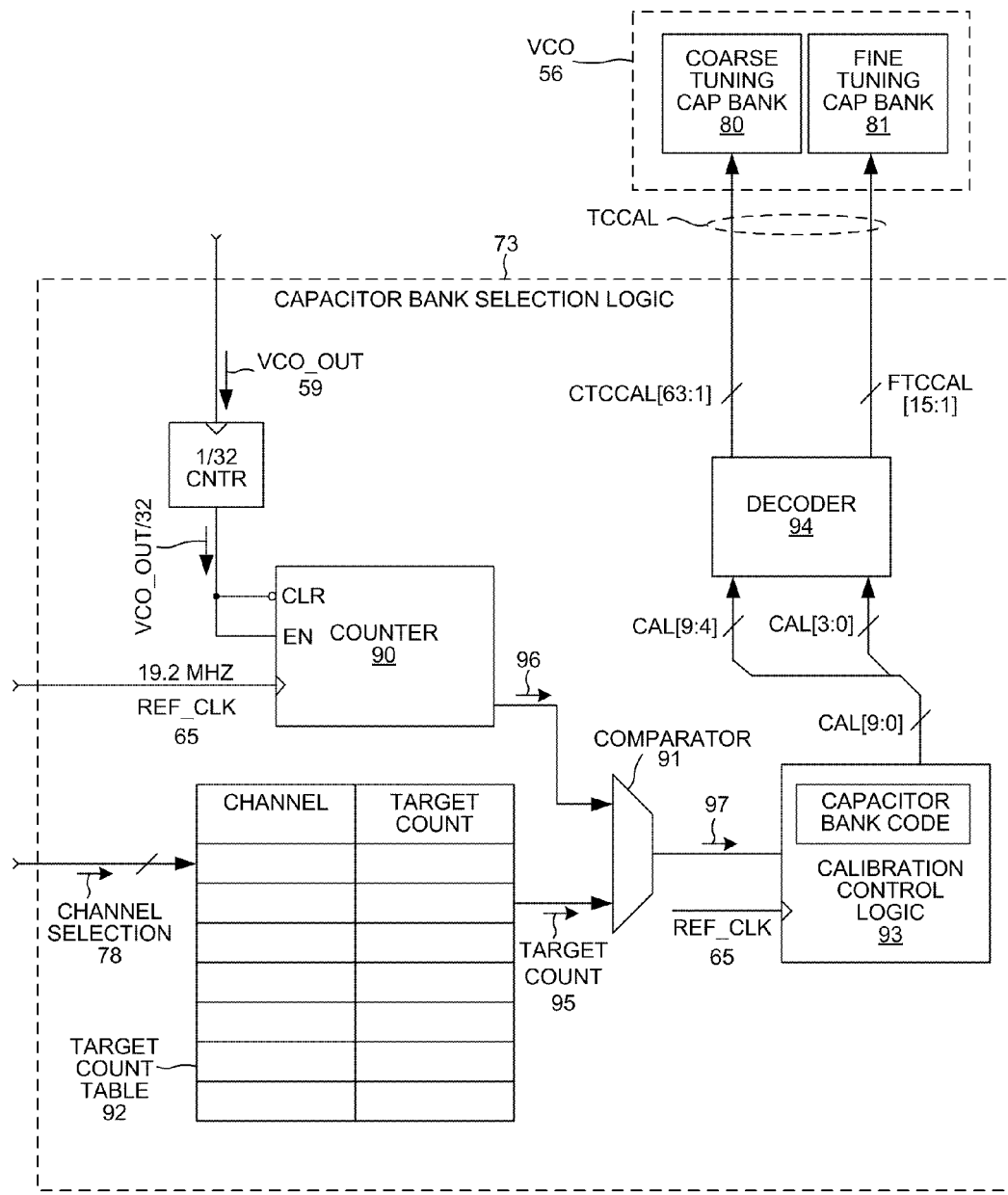
FIG. 7 is a simplified block diagram of capacitor bank selection logic 73 of FIG. 4. The capacitor bank selection logic 73 selectively activates capacitor elements of the coarse capacitor bank and the fine capacitor bank to achieve a VCO oscillation frequency approximately equal to a target frequency.
Figure 8:
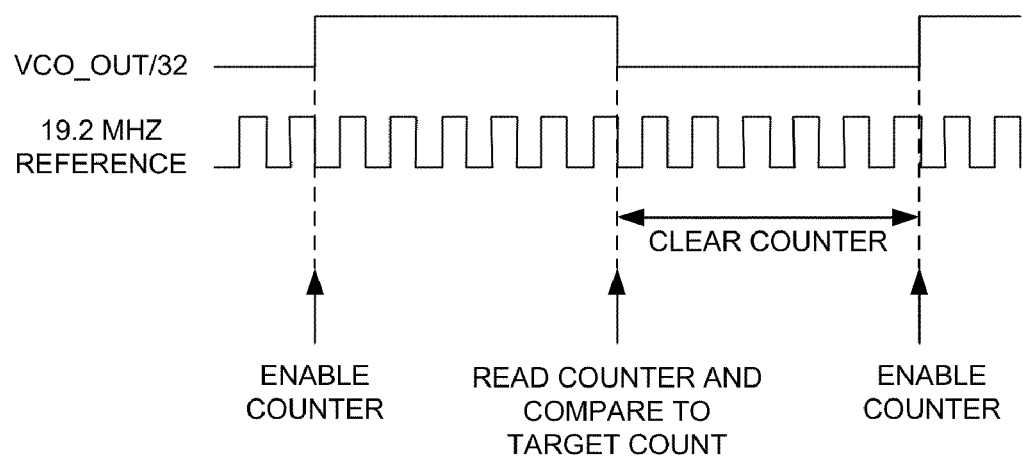
FIG. 8 is a simplified waveform diagram that illustrates how capacitor bank selection logic 73 measures the oscillation frequency of the VCO 56 of FIG. 4.

FIG. 7 is a diagram showing capacitor bank selection logic 73 in more detail. In one implementation, capacitor bank selection logic 73 receives a multi-bit digital signal indicating a channel selection 78, the output signal 59 of VCO 56, and the reference clock signal 65. Capacitor bank selection logic 73 processes these signals to generate digital control signals CTCCAL and FTCCAL. CTCCAL[63:1] controls each coarse tuning capacitor element 85 of the coarse tuning capacitor bank 80 and FTCCAL[15:1] controls each fine tuning capacitor element 86 of the fine tuning capacitor bank 81. VCO output signal 59 is divided down, for example, by a factor of 32. As illustrated in FIG. 8, counter circuit 90 is enabled on each rising edge of divided down VCO output signal 59. Counter 90 then counts the number of cycles of reference clock signal 65 until the next falling edge of the divided down VCO output signal 59 is reached. Counter 90 therefore counts during the high portion of the VCO_OUT/32 signal illustrated in FIG. 8. Counter 90 outputs the measured count 96, and is then held in the cleared state until the next rising edge of VCO_OUT/32 is reached. Target count table 92 (see FIG. 7) receives the multi-bit digital channel selection signal 78 and outputs a target count number 95 associated with the channel selection. For each channel there is a corresponding target oscillation frequency of VCO 56. Depending on the particular frequency value of reference clock signal 65, there is a corresponding target count number 95 associated with each target oscillation frequency. Comparator 91 compares the target count number 95 with the measured count number 96 and outputs a difference signal 97 to an amount of calibration control logic 93. Calibration control logic 93 generates a 10-bit digital word comprising a six-bit coarse capacitor bank code (CAL[9:4]) and a 4-bit fine capacitor bank code (CAL[3:0]) in response to the difference signal 97. Decoder 94 receives the coarse code and the fine code, decodes these signals, and outputs corresponding binary digital control signals CTCCAL[63:1] and FTCCAL[15:1] to coarse tuning capacitor bank 80 and fine tuning capacitor bank 81, respectively. Capacitor bank selection logic 73 repeats this process until a capacitor bank code is selected that results in an oscillation frequency as close as possible to the target frequency associated with the selected channel. When a new channel selection is made the code is iteratively recalculated again. In this example, it is not necessary to store capacitor bank codes associated with selected channels, thus eliminating the need to store an extensive list of codes in memory for each device. Furthermore, it is not necessary to engage in off-line calibration for each device. In other examples, specific capacitor bank codes associated with selected channels may be stored to reduce or eliminate the number of calibration steps required to converge to the target frequency for each channel selection.

In the design of capacitor bank selection logic 73 in one example, the logic is defined in a hardware description language, and the description is then synthesized to generate hardware logic using commercially available synthesis tools.

Figure 9A:
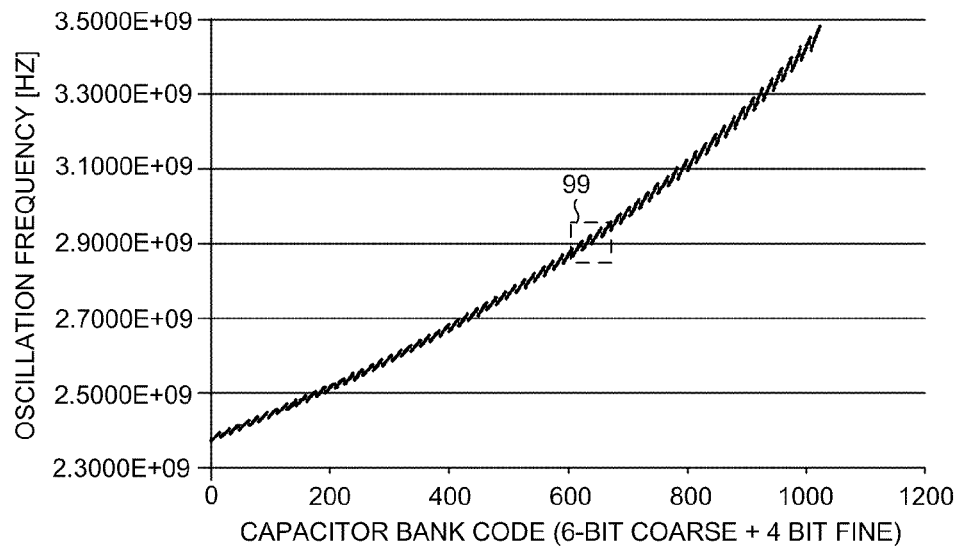
FIG. 9A illustrates a simulation of the overlapping of VCO oscillation frequency for different capacitor bank control codes.
Figure 9B:
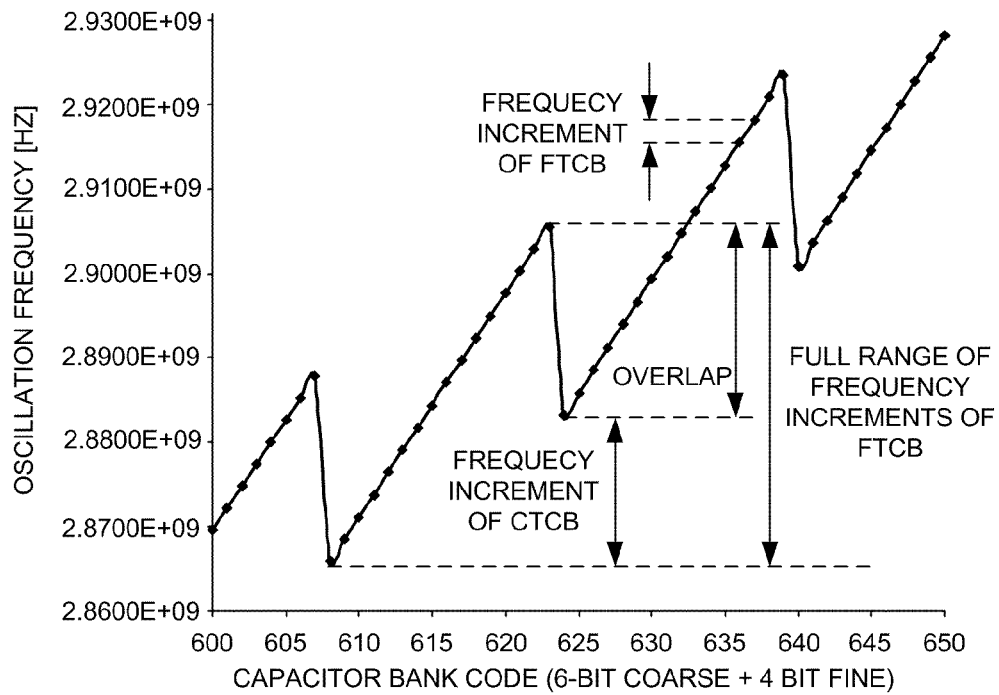
FIG. 9B illustrates a zoomed in version of the illustration of FIG. 9A.

FIG. 9A illustrates a simulation of the overlap in capacitance value between the coarse and fine tuning capacitor banks as a function of capacitor bank code. In this example, the 10-bit digital word output by calibration control logic 93 is a capacitor bank code of 1024 values. Each capacitor bank code value corresponds to a specific number of active coarse tuning capacitor elements 85 and active fine tuning capacitor elements 86 operating in concert. As more capacitor elements are activated, the capacitance value of the LC resonant tank 83 is increased and the oscillation frequency of VCO 56 decreases. FIG. 9A illustrates the range of oscillation frequency achieved by the combination of the six-bit coarse tuning capacitor bank coupled with the 4-bit fine tuning capacitor bank. When a channel selection is made, capacitor bank selection logic 73 responds by iteratively selecting a series of capacitor bank codes that move about the range of oscillation frequencies illustrated in FIG. 9A. The series of codes are selected to move progressively closer to a match between the oscillation frequency and the target frequency associated with the channel selection. The search ends when the full 10-bit resolution of the code has been exhausted FIG. 9B shows the capacitance overlap in box 99 of FIG. 9A in further detail. The successive activation of each coarse tuning capacitor element 85 results in a jump in oscillation frequency. The magnitude of this coarse frequency increment of the coarse tuning capacitor bank 80 is determined by capacitance value, A, while the range of oscillation frequencies that can be reached using the coarse tuning capacitor bank 80 is determined by the coarse frequency increment and the number of coarse tuning capacitor elements 85 that make up the coarse tuning capacitor bank 80. Without the fine tuning capacitor bank 81, varactor 82 would have to span this large course frequency increment, resulting in an undesirably high gain VCO as discussed above. This may be avoided by designing the full range of frequency increments of the fine tuning capacitor bank to interpolate between the coarse frequency increments. Furthermore, without the fine tuning capacitor bank, varactor 82 would have to compensate of variations in the size of the course frequency increment due to capacitor mismatches. This is avoided by designing an overlap between the full range of frequency increments of the fine tuning capacitor bank and each coarse frequency increment. The successive activation of each fine tuning capacitor element 86 also results in a jump in oscillation frequency. The magnitude of this fine frequency increment of the fine tuning capacitor bank 81 is determined by capacitance value, B, while the range of oscillation frequencies that can be reached using the fine tuning capacitor bank 81 is determined by the fine frequency increment and the number of fine tuning capacitor elements 86 that make up the fine tuning capacitor bank 81. In this preferred embodiment, the capacitance value B is selected such that the capacitance value of fifteen fine tuning capacitor elements is substantially similar to two coarse tuning capacitor elements. This results in an overlap in oscillation frequency such that the full range of fifteen fine frequency increments of the fine tuning capacitor bank 81 is substantially similar to two coarse frequency increments of the coarse tuning capacitor bank 80.

FIG. 10A illustrates one approach to the operation of calibration control logic 93. FIG. 10A illustrates an example of an iterative binary search over the entire 10-bit capacitor bank code. The search begins in the middle of the 10-bit code at decimal value 512. At each iteration the indication of difference signal 97 between the target VCO oscillation frequency and the oscillation frequency of the VCO output signal 59 guides the selection of the next 10-bit capacitor bank code. As illustrated in FIG. 10A, the oscillation frequency of the VCO output signal 59 is greater than the target for the first four iterations. Thus, for the first four iterations, calibration control logic 93 successively halves the capacitor bank code, driving the oscillation frequency of the VCO output signal 59 toward the target. At the fifth iteration, the oscillation frequency of the VCO output signal 59 is slightly lower than the target, thus calibration control logic 93 splits the difference between the two previous codes. At the sixth iteration, the oscillation frequency of the VCO output signal 59 is once again greater than the target, thus calibration control logic 93 continues the binary search downward until the resolution of the 10-bit capacitor bank code is exhausted.

FIG. 10B illustrates another approach to the operation of calibration control logic 93 where an iterative binary search is first performed over the six-bit coarse tuning capacitor bank code and then performed over the four-bit fine tuning capacitor bank code. In this example, both the six-bit code and the four-bit code are initially set to the middle of their respective ranges. The coarse code is successively halved until the indication of difference signal 97 changes. In this example, at iteration 7, the oscillation frequency of the VCO output signal 59 drops below the target. As a consequence, calibration control logic 93 sets the six-bit coarse tuning capacitor bank code to the previous value and continues the binary search on the four-bit fine tuning capacitor bank until the resolution of the 4-bit fine tuning capacitor bank is exhausted.

Figure 11:
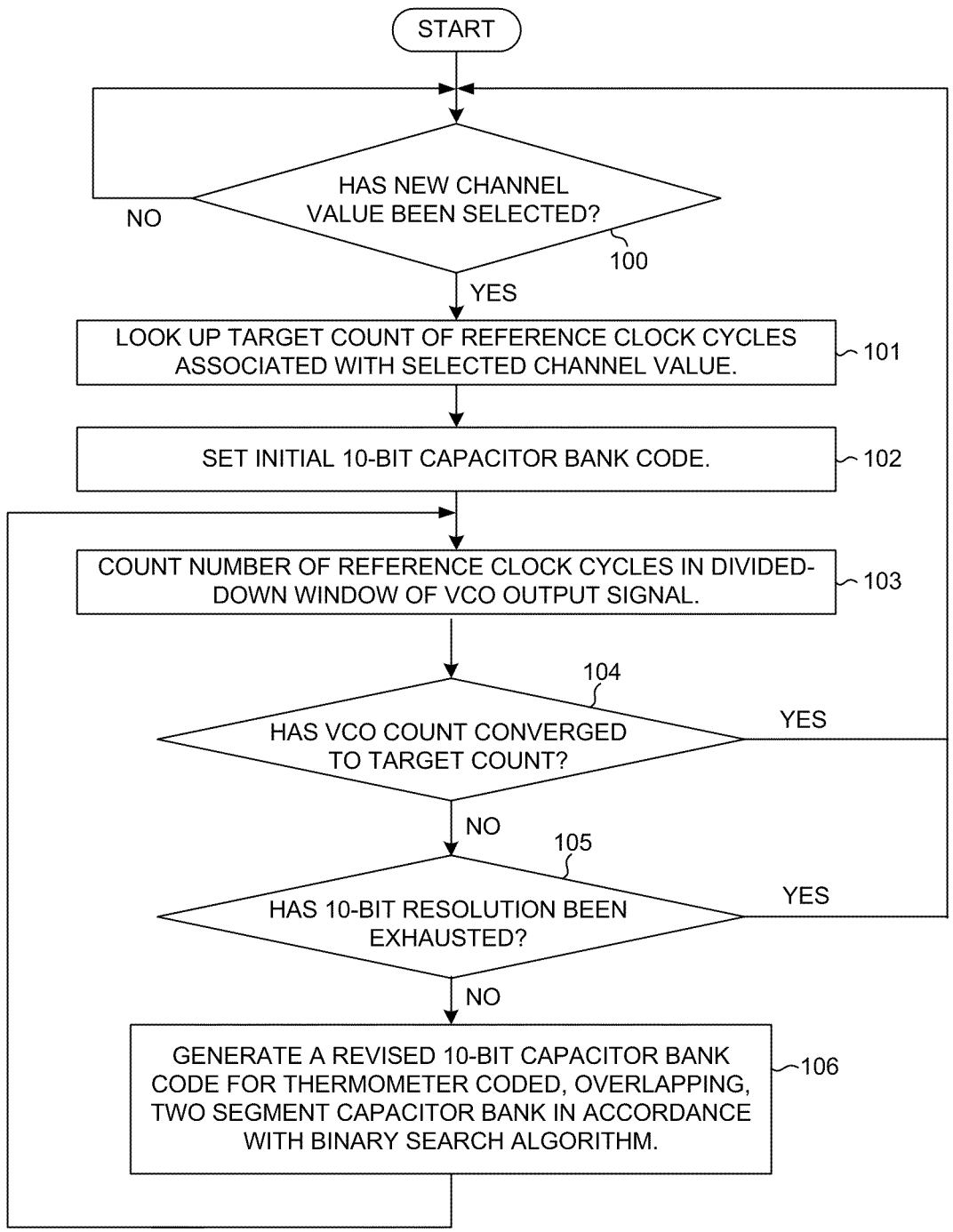
FIG. 11 is a flowchart of a method of selecting a capacitor bank control code to achieve a VCO oscillation frequency approximately equal to a target frequency.

FIG. 11 is a simplified flowchart illustrative of a method of calibrating a 10-bit capacitor control code of an overlapping, two-segment capacitor bank. In a first step (step 100), capacitor bank selection logic 73 waits to receive a newly selected channel value. In a second step (step 101) capacitor bank selection logic 73 looks up a target count of reference clock cycles associated with the selected channel value. In a third step (step 102), calibration control logic 93 of capacitor bank selection logic 73 sets an initial 10-bit capacitor bank code. In a fourth step (step 103), capacitor bank selection logic 73 counts the number of reference clock cycles in a divided down window of VCO output signal 59. In a fifth step (step 104), capacitor bank selection logic 73 determines whether the number of reference clock cycles in the divided down window of VCO output signal 59 equals the target count. If, yes, the calibration is complete and capacitor bank selection logic 73 waits to receive a newly selected channel value (step 100). If no, capacitor bank selection logic 73 determines whether the search has exhausted the ten bits of capacitor bank code resolution (step 105). If yes, the calibration is complete and capacitor bank selection logic 73 waits to receive a newly selected channel value (step 100). If no, calibration control logic 93 of capacitor bank selection logic 73 generates a revised ten bit capacitor bank code for the overlapping, two-segment capacitor bank in accordance with a binary search algorithm (step 106). Steps 103-106 are iterated until one of the exit conditions (step 104 or step 105) is met. In one example, approximately one microsecond is required to iterate steps 103-106 until one of the exit conditions (step 104 or 105) is met.

Figure 12:
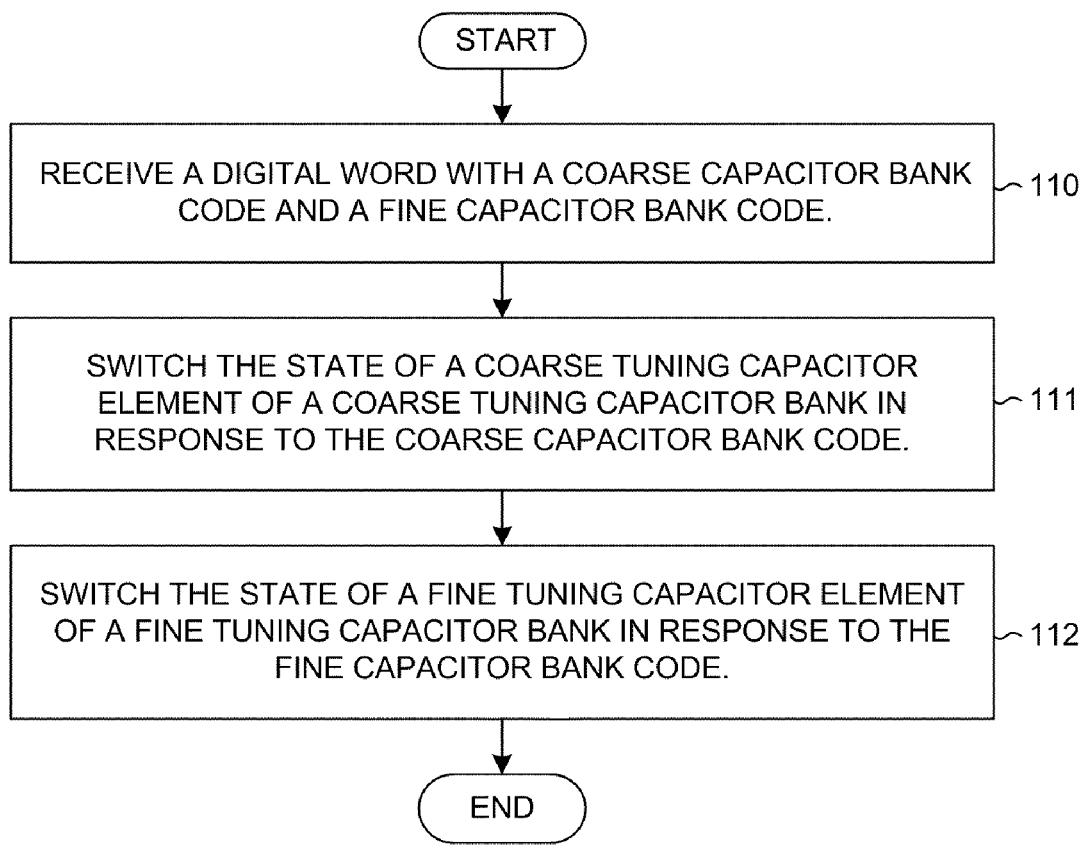
FIG. 12 is a flowchart of a method of controlling an oscillation frequency of a VCO using a two segment capacitor bank.

FIG. 12 illustrates a method of controlling the oscillation frequency of a VCO using an overlapping, two-segment capacitor bank. In a first step (step 110), a multi-bit digital word is received, wherein the word includes a coarse capacitor bank code and a fine capacitor bank code. In a second step (step 111) the state of a coarse tuning capacitor element of a coarse tuning capacitor bank is switched in response to the coarse capacitor code. In a third step (step 112) the state of a fine tuning capacitor element of a fine tuning capacitor bank is switched in response to the fine capacitor code.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. RF transceiver IC 27 and FM transceiver IC 28 are described above as being separate integrated circuits. In another embodiment, however, RF transceiver IC 27 and FM transceiver IC 28 are integrated onto the same integrated circuit. In yet another embodiment, both the analog and the digital functions of mobile communication device 26 are performed on a single integrated circuit, called a system on a chip (SOC). In the SOC implementation, RF transceiver IC 27, FM transceiver IC 28 and digital baseband IC 33 are all integrated onto the same integrated circuit. Accordingly, various modifications, adaptations, and combinations of the various features of the described specific embodiments can be practiced without departing from the scope of the claims that are set forth below.

What is claimed is:

1. An oscillator comprising:
    a first oscillating node;
    a second oscillating node;
    a first plurality of first tuning capacitor elements, wherein each first tuning capacitor element in a first state provides a first capacitance between the first and second oscillating nodes, and wherein each first tuning capacitor element in a second state provides substantially no capacitance between the first and second oscillating nodes;
    a second plurality of second tuning capacitor elements, wherein each second tuning capacitor element in a first state provides a second capacitance between the first and second oscillating nodes, wherein each second tuning capacitor element in a second state provides substantially no capacitance between the first and second oscillating nodes, wherein the second capacitance is smaller than the first capacitance; and
    an amount of capacitor bank selection logic coupled to both the first plurality of first tuning capacitor elements and the second plurality of second tuning capacitor elements, wherein the amount of capacitor bank selection logic generates a first capacitor bank code and a second capacitor bank code in response to a difference between an oscillation frequency of the oscillator and a target oscillation frequency.

2. The oscillator of claim 1, wherein each of the first tuning capacitor elements comprises:
    a first capacitor having a first lead and a second lead, wherein the first lead is coupled to the first oscillating node;
    a second capacitor having a first lead and a second lead, wherein the first lead is coupled to the second oscillating node; and
    a switching element that in the first state is conductive and couples the second lead of the first capacitor to the second lead of the second capacitor, and in the second state is substantially nonconductive.

3. The oscillator of claim 1, wherein the first plurality of first tuning elements is a first thermometer-coded capacitor bank, and wherein the second plurality of second tuning elements is a second thermometer-coded capacitor bank.

4. The oscillator of claim 1, wherein there is a number, Y, of second tuning capacitor elements, and wherein the product of Y and the second capacitance is greater than the first capacitance.

5. The oscillator of claim 1, wherein the oscillator is a Voltage Controlled Oscillator within a Frequency Modulation (FM) radio receiver.

6. The oscillator of claim 2, wherein the switching element is controlled by a digital bit, and wherein the switching element is caused to be in the first state for a first value of the digital bit and is caused to be in the second state for a second value of the digital bit.

7. The oscillator of claim 1,
    wherein the first capacitor bank code determines whether each first tuning capacitor element is in the first state and whether each first tuning capacitor element is in the second state.

8. A method comprising:
    generating a first capacitor bank code and a second capacitor bank code in response to a difference between an oscillation frequency of an oscillator and a target oscillation frequency;
    switching a state of a first tuning capacitor element in response to the first capacitor bank code, wherein the first tuning capacitor element is one of a first plurality of first tuning capacitor elements, wherein each first tuning capacitor element in a first state provides a first capacitance between a first oscillating node and a second oscillating node of the oscillator, and wherein each first tuning capacitor element in a second state provides substantially no capacitance between the first and second oscillating nodes; and
    switching a state of a second tuning capacitor element in response to the second capacitor bank code, wherein the second tuning capacitor element is one of a second plurality of second tuning capacitor elements, wherein each second tuning capacitor element in a first state provides a second capacitance between the first oscillating node and the second oscillating node, and wherein each second tuning capacitor element in a second state provides substantially no capacitance between the first and second oscillating nodes.

9. The method of claim 8, wherein the first capacitance is less than a summed capacitance of each of the second plurality of second tuning capacitor elements when each of the second plurality of second tuning capacitor elements is in the first state.

10. The method of claim 8, further comprising:
decoding the first capacitor bank code to generate a first plurality of digital bits, wherein a digital bit of the first plurality determines the state of the first tuning capacitor element; and
decoding the second capacitor bank code to generate a second plurality of digital bits, wherein a digital bit of the second plurality determines the state of the second tuning capacitor element.

11. The method of claim 8, wherein the capacitance of each of the first plurality of first tuning capacitor elements and the capacitance of each of the second plurality of second tuning capacitor elements determines the oscillation frequency of the oscillator, and wherein the oscillator is a Voltage Controlled Oscillator (VCO).

12. The method of claim 11, wherein the oscillation frequency of the VCO ranges from 2.736 gigahertz to 3.127 gigahertz.

13. An oscillator comprising:
a first oscillating node;
a second oscillating node;
a first plurality of first tuning capacitor elements, wherein each first tuning capacitor element in a first state provides a first capacitance between the first and second oscillating nodes, and wherein each first tuning capacitor element in a second state provides substantially no capacitance between the first and second oscillating nodes;
a second plurality of second tuning capacitor elements, wherein each second tuning capacitor element in a first state provides a second capacitance between the first and second oscillating nodes, wherein each second tuning capacitor element in a second state provides substantially no capacitance between the first and second oscillating nodes; and
a capacitor bank selection logic, coupled to both the first plurality of first tuning capacitor elements and the second plurality of second tuning capacitor elements, for generating a first capacitor bank code and a second capacitor bank code in response to a difference between an oscillation frequency of the oscillator and a target oscillation frequency, for switching between the first state and the second state of each first tuning capacitor element based on the first capacitor bank code and for switching between the first state and the second state of each second tuning capacitor element based on the second capacitor bank code.

14. The oscillator of claim 13, wherein there is a number, Y, of second tuning capacitor elements, and wherein the product of Y and the second capacitance is greater than the first capacitance.

15. The apparatus of claim 13, wherein the capacitor bank selection logic comprises changing a digital word.

16. A computer program product, comprising:
a non-transitory computer-readable medium embodying codes executable by a processor to cause the processor to perform operations of:
generating a first capacitor bank code and a second capacitor bank code in response to a difference between an oscillation frequency of an oscillator and a target oscillation frequency;
switching a state of a first tuning capacitor element in response to the first capacitor bank code, wherein the first tuning capacitor element is one of a first plurality of first tuning capacitor elements, wherein each first tuning capacitor element in a first state provides a first capacitance between a first oscillating node and a second oscillating node of the oscillator, and wherein each first tuning capacitor element in a second state provides substantially no capacitance between the first and second oscillating nodes; and
switching a state of a second tuning capacitor element in response to the second capacitor bank code, wherein the second tuning capacitor element is one of a second plurality of second tuning capacitor elements, wherein each second tuning capacitor element in a first state provides a second capacitance between the first oscillating node and the second oscillating node, and wherein each second tuning capacitor element in a second state provides substantially no capacitance between the first and second oscillating nodes.

17. The non-transitory computer-readable medium of claim 16, said codes configured to cause the processor to perform an operation of setting each of the second plurality of second tuning capacitor elements in the first state so that the first capacitance is less than a summed capacitance of each of the second plurality of second tuning capacitor elements.

18. The non-transitory computer-readable medium of claim 16, said codes configured to cause the processor to perform operations of:
decoding the first capacitor bank code to generate a first plurality of digital bits, wherein a digital bit of the first plurality determines the state of the first tuning capacitor element; and
decoding the second capacitor bank code to generate a second plurality of digital bits, wherein a digital bit of the second plurality determines the state of the second tuning capacitor element.

19. The non-transitory computer-readable medium of claim 16, said codes configured to cause the processor to perform an operation of determining the oscillation frequency of the oscillator by setting the capacitance of each of the first plurality of first tuning capacitor elements and the capacitance of each of the second plurality of second tuning capacitor elements, and wherein the oscillator is a Voltage Controlled Oscillator (VCO).

* * * * *